United States Patent
Czaplewski et al.

(10) Patent No.: US 11,335,621 B2
(45) Date of Patent: May 17, 2022

(54) COMPOSITE THERMAL INTERFACE OBJECTS

(71) Applicant: International Business Machines Corporation, Armonk, NY (US)

(72) Inventors: Sarah K. Czaplewski, Rochester, MN (US); Joseph Kuczynski, North Port, FL (US); Melissa K. Miller, Research Triangle Park, NC (US); Rebecca Nadeau Morones, Berthoud, CO (US)

(73) Assignee: International Business Machines Corporation, Armonk, NY (US)

(*) Notice: Subject to any disclaimer, the term of this patent is extended or adjusted under 35 U.S.C. 154(b) by 251 days.

(21) Appl. No.: 15/214,167

(22) Filed: Jul. 19, 2016

(65) Prior Publication Data

US 2018/0027691 A1 Jan. 25, 2018

(51) Int. Cl.
| | |
|---|---|
| *H01L 23/373* | (2006.01) |
| *B29L 31/18* | (2006.01) |
| *B29C 43/18* | (2006.01) |
| *H01L 23/42* | (2006.01) |
| *B29K 507/04* | (2006.01) |
| *B29K 105/18* | (2006.01) |
| *B29K 105/16* | (2006.01) |
| *B29C 43/20* | (2006.01) |

(52) U.S. Cl.
CPC .......... *H01L 23/3733* (2013.01); *B29C 43/18* (2013.01); *H01L 23/42* (2013.01); *B29C 43/203* (2013.01); *B29C 2043/189* (2013.01); *B29K 2105/16* (2013.01); *B29K 2105/18* (2013.01); *B29K 2507/04* (2013.01); *B29K 2995/0013* (2013.01); *B29L 2031/18* (2013.01)

(58) Field of Classification Search
CPC ............................................. H01L 23/36–3738
See application file for complete search history.

(56) References Cited

U.S. PATENT DOCUMENTS

| | | | | |
|---|---|---|---|---|
| 4,962,416 A | * | 10/1990 | Jones ................ | H01L 23/057 257/722 |
| 5,296,310 A | * | 3/1994 | Kibler ................ | B32B 5/16 428/614 |
| 6,104,090 A | * | 8/2000 | Unger ................ | H01L 23/3733 257/677 |

(Continued)

FOREIGN PATENT DOCUMENTS

WO WO 2008115530 A2 * 9/2008 ............. B82Y 10/00

OTHER PUBLICATIONS

U.S. Non-Provisional Application entitled "Designing Objects Having Thermal Interface Properties for Thermal Conductivity", U.S. Appl. No. 14/944,791, filed Nov. 18, 2015, 25 pp.

*Primary Examiner* — Humera N. Sheikh
*Assistant Examiner* — Elizabeth D Ivey
(74) *Attorney, Agent, or Firm* — Patterson + Sheridan, LLP

(57) ABSTRACT

In an example, a composite thermal interface object includes a first layer including a first thermal interface material that has first compliance characteristics. The first layer includes first graphite fibers, and the first graphite fibers are aligned in a direction that is substantially orthogonal to a surface of the first layer. The composite thermal interface object further includes a second layer including a second thermal interface material that has second compliance characteristics that are different from the first compliance characteristics.

20 Claims, 6 Drawing Sheets

(56) References Cited

U.S. PATENT DOCUMENTS

| | | | |
|---|---|---|---|
| 6,449,155 B1 | 9/2002 | Colbert et al. | |
| 6,653,730 B2 | 11/2003 | Chrysler et al. | |
| 6,956,739 B2* | 10/2005 | Bunyan | H01L 23/4275 |
| | | | 257/E23.089 |
| 8,773,856 B2 | 7/2014 | Petroski | |
| 8,837,151 B2 | 9/2014 | Hill et al. | |
| 2002/0042995 A1* | 4/2002 | Eaton | C09K 5/06 |
| | | | 29/890.03 |
| 2006/0250773 A1* | 11/2006 | Campbell | H01L 23/4735 |
| | | | 361/699 |
| 2006/0268521 A1* | 11/2006 | Coffin | H01L 23/42 |
| | | | 361/705 |
| 2007/0000642 A1* | 1/2007 | Yamazaki | H01L 23/3677 |
| | | | 165/80.3 |
| 2008/0029883 A1 | 2/2008 | Sung | |
| 2009/0096087 A1* | 4/2009 | Sauciuc | H01L 23/3735 |
| | | | 257/717 |
| 2010/0085713 A1 | 4/2010 | Balandin et al. | |
| 2010/0321895 A1* | 12/2010 | Hill | F28F 21/02 |
| | | | 361/715 |
| 2012/0040523 A1 | 2/2012 | Kondo | |
| 2013/0040135 A1* | 2/2013 | Hirano | C08K 3/34 |
| | | | 428/353 |
| 2014/0334103 A1 | 11/2014 | Schulz-Harder et al. | |
| 2014/0374071 A1* | 12/2014 | Timmerman | H01L 24/29 |
| | | | 165/133 |
| 2014/0374080 A1* | 12/2014 | Hill | H05K 7/20472 |
| | | | 165/185 |
| 2015/0279761 A1 | 10/2015 | Bet-Shliemoun | |
| 2015/0362266 A1* | 12/2015 | Liu | F28F 21/02 |
| | | | 165/185 |

* cited by examiner

COMPOSITE THERMAL INTERFACE OBJECTS

I. FIELD OF THE DISCLOSURE

The present disclosure relates generally to thermal interface objects.

II. BACKGROUND

Thermal interface materials (TIMs) are materials that are employed to reduce thermal resistance at a thermal interface of a heat source and a heat exchanger (e.g., a heat sink). Conformable TIMs (e.g., a conformal thermal interface pad) are TIMs that are able to conform, under an applied force (e.g., pressure), to a surface. Because conformable TIMs reduce the presence of air gaps between surfaces of the heat source (e.g., an electrical or electronic component) and the heat sink, they can improve thermal conductivity. However, a conformable TIM may become stuck to the electrical component (e.g., a lid of a central processing unit (CPU)), to the heat sink, or both. During removal of the heat sink, the conformal TIM may adhere to the heat sink and the lid of the CPU and may lift the CPU out of its socket (e.g., a land grid array (LGA)). However, the adherence of the conformal TIM may not be strong enough to support the CPU, and the CPU may subsequently fall back down and damage the socket.

III. SUMMARY OF THE DISCLOSURE

According to an implementation, a composite thermal interface object includes a first layer including a first thermal interface material that has first compliance characteristics. The first layer includes first graphite fibers, and the first graphite fibers are aligned in a direction that is substantially orthogonal to a surface of the first layer. The composite thermal interface object further includes a second layer including a second thermal interface material that has second compliance characteristics that are different from the first compliance characteristics.

According to another implementation, a method of forming a composite thermal interface object includes depositing, using a compression mold, a second layer of a second thermal interface material on a surface of a first layer. The first layer includes a first thermal interface material that has first compliance characteristics. The first thermal interface material includes first graphite fibers, and the first graphite fibers are aligned in a direction that is substantially orthogonal to the surface of the first layer. The method further includes curing the second thermal interface material, where the first compliance characteristics of the first thermal interface material are different from second compliance characteristics of the second thermal interface material.

According to another implementation, a method of forming a composite thermal interface object includes determining a topography of a surface of a first component of a thermal interface. The method further includes extruding a second thermal interface material on a surface of a first layer based on the topography of the surface of the first component. The first layer includes a first thermal interface material that has first compliance characteristics that are different from second compliance characteristics of the second thermal interface material. The first thermal interface material includes first graphite fibers, and the first graphite fibers are aligned in a direction that is substantially orthogonal to the surface of the first layer.

One advantage of the present disclosure is the ability to make a composite thermal interface object. The composite thermal interface object may provide high thermal conductivity while reducing or preventing damage to electrical components upon removal. By adding a stiffer layer of thermal interface material to a complaint thermal interface object, adherence to the electrical components may be reduced (which may reduce or prevent damage to the electrical components), while retaining the high thermal conductivity of compliant thermal interface pads. Additionally, by forming a surface of the composite thermal interface object based on a surface of a component of a thermal interface, the composite thermal interface object may reduce air gaps and further increase thermal conductivity.

Features and other benefits that characterize implementations are set forth in the claims annexed hereto and forming a further part hereof. However, for a better understanding of the implementations, and of the advantages and objectives attained through their use, reference should be made to the Drawings and to the accompanying descriptive matter.

IV. BRIEF DESCRIPTION OF THE DRAWINGS

V. DETAILED DESCRIPTION

Figure 1:
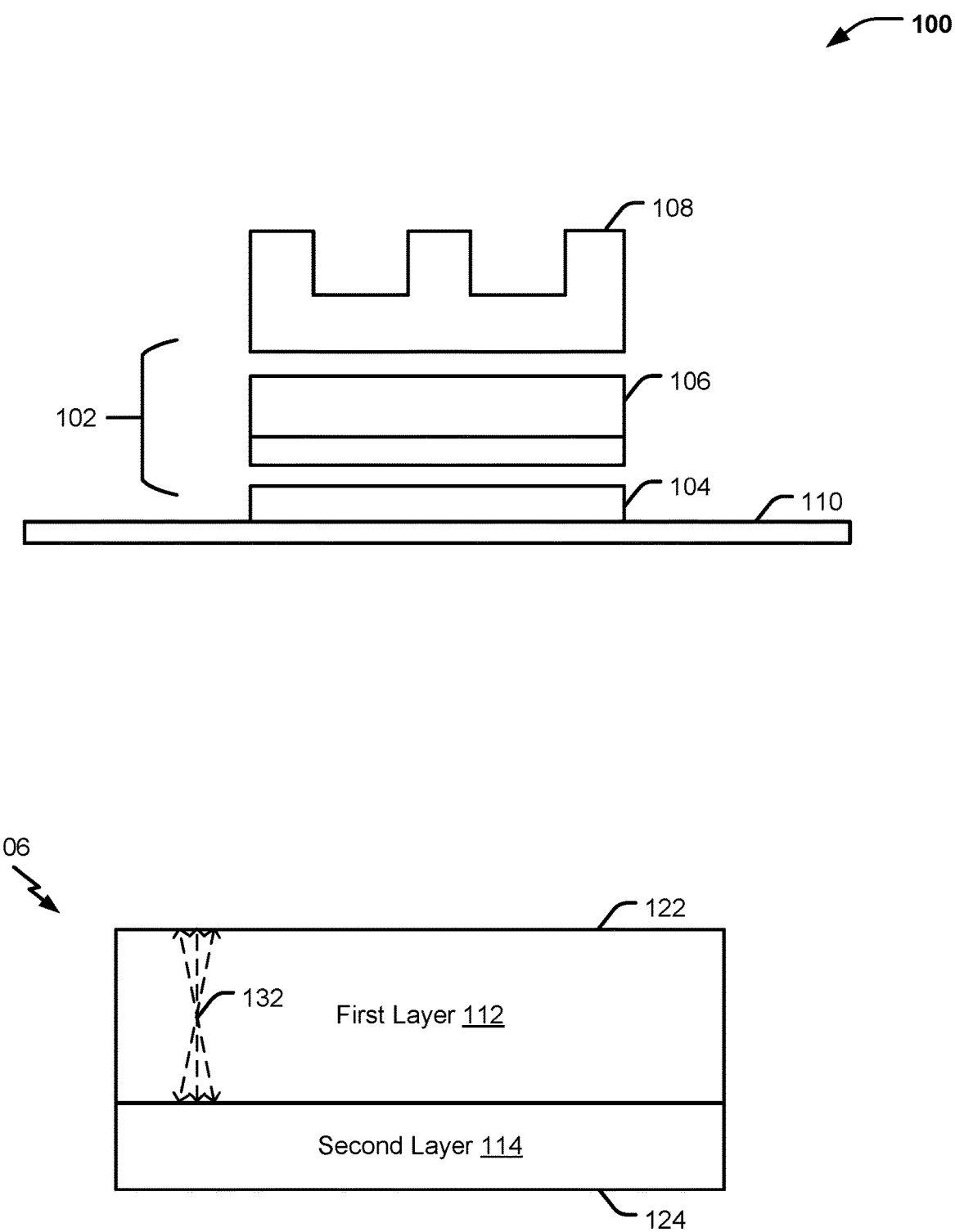
FIG. 1 is a diagram illustrating an example of a composite thermal interface object of a thermal interface.

The present disclosure relates to composite thermal interface objects suitable for use in thermal interfaces and methods for forming a composite thermal interface object. Composite thermal interface objects may include multiple layers of different thermal interface materials (TIMs). A TIM is a material that has relatively high thermal conductivity as compared to other materials or mediums (e.g., air). A TIM or a composite thermal interface object may be inserted between a heat producing device (e.g. a heat source) and a heat dissipation device (e.g. a heat sink) to form a thermal interface.

The heat source and heat sink surfaces may each have a combination of surface roughness and surface non-flatness. On a macroscopic level, this roughness is non-planar, (e.g., a concave surface, a convex surface, a wavy surface, an irregular surface, or a combination thereof) across the surface. When the heat source and the heat sink are joined to form a thermal interface, the surface roughness and non-flatness results in the thermal interface being separated by air filled gaps without the presence of TIM or a thermal interface object (e.g., a thermal interface pad). Thermal resistance may be reduced by eliminating air gaps and increasing a contact area (e.g., thermal contacts) between the heat source and the heat sink by using a TIM or a thermal interface object of high thermal conductivity (relative to the air) that can conform to the imperfect surface features (e.g., a surface topography) of the surfaces.

Some conventional thermal interface pads are complaint and may be able to conform to the imperfect surface features (e.g., the surface topography) of the surfaces of the components of the thermal interface under an applied force (e.g., pressure). This results in air gaps being reduced or eliminated between the surfaces of the heat source and the heat sink. However, a compliant thermal interface pad may adhere to the surfaces of the heat sink and the heat source (e.g., a semiconductor device), which can lead to damaging the heat source or a socket of the heat source.

Adherence to the heat source or heat socket may be reduced by forming a composite thermal interface object with multiple layers, including a less compliant (e.g., stiffer) layer of less conforming TIM. The less compliant layer may reduce adherence to a surface of either the heat sink or the heat source. Thus, upon removal of the heat sink, the composite thermal interface object may be less prone to lift, drop, and damage the heat source or the socket. To illustrate, a composite thermal interface object may include a first layer and a second layer. A first TIM of the first layer may have first compliance characteristics that are different from second compliance characteristics of a second TIM of the second layer. As an illustrative, non-limiting example, a first elastic modulus of the first TIM may be less than a second elastic modulus of the second TIM. Thus, the first layer may be more complaint (less stiff) than the second layer.

In some implementations, a layer of the composite thermal interface object may be generated or formed based on a surface of a component (e.g., a heat sink or a heat source) of the thermal interface. For example, a first layer of the composite thermal interface object may be formed to have a first surface that mates with a surface of a component of the thermal interface. To illustrate, the surface of the component of the thermal interface may be scanned or measured to generate measurement data that is indicative of a topography of the surface of the component. As an illustrative, non-limiting example, the first layer may be generated by a three-dimensional (3D) printing device depositing a first TIM based on the measurement data. As another illustrative, non-limiting example, the first layer may be formed independent of the measurement data, and then machined, etched, or laser cut based on the measurement data. Accordingly, the first surface of the first layer may have a topography that corresponds to an inverted topography of the surface of the component.

Additionally or alternatively, the second layer may be formed to have a second surface that mates with a surface of another component of the thermal interface. As an illustrative, non-limiting example, the second layer may be formed on the first layer by a 3D printing device. To illustrate, the 3D printing device may deposit a second TIM based on an inverted topography of the surface of the other component of the thermal interface. Thus, the composite thermal interface object may reduce air gaps between the surfaces of the composite thermal interface object and the surfaces of the components of the thermal interface. Accordingly, the composite thermal interface object may provide lower thermal resistance and higher thermal conductivity than thermal interface pads.

As further described herein, the composite thermal interface objects of the present disclosure may be generated or formed using a variety of fabrication processes or methods. In some implementations, forming a composite thermal interface object includes depositing a second layer of a second TIM on a surface of a first layer of a first TIM having first compliance characteristics. The second layer may be deposited by a 3D printing device or by molding (e.g., compression molding, transfer molding, matrix molding injection molding, extrusion molding, etc.). The second layer is then cured. For example, the second TIM may be heated, cooled, exposed to ultraviolet light, or a combination thereof to cure the second layer.

In some implementations, forming a composite thermal interface object includes determining a topography of a surface of a component (e.g., a heat source or a heat sink) of a thermal interface. For example, a surface of the heat source may be scanned by a scanning device to generate measurement data. The measurement data may be indicative of a topography of the surface of the heat source. A second layer (e.g., the stiffer layer) of the composite thermal interface object may be formed to have a surface topography that corresponds to an inverted surface topography of the surface of the heat source. For example, the second layer may be formed by extruding a second TIM on a surface of the first layer based on the topography of the surface of the heat source. The second layer may be formed such that when the surface of the second layer is coupled with the surface of the heat source, air gaps are reduced or eliminated. Thus, the composite thermal interface object may have an increased thermal conductivity and a reduced risk of damaging components of a thermal interface as compared to conventional thermal interface pads.

Referring to FIG. 1, a diagram 100 illustrates a thermal interface 102 and a composite thermal interface object 106. The thermal interface 102 includes a first component 104, the composite thermal interface object 106, and a second component 108. In FIG. 1, the first component 104, the composite thermal interface object 106, and the second component 108 are illustrated as separated by gaps; however, during use, the first component 104 and the composite thermal interface object 106 are in direct, intimate physical contact and the composite thermal interface object 106 and the second component 108 are in direct, intimate physical contact.

The first component 104 of the thermal interface 102 may include or correspond to a heat producing device (e.g., a heat source). For example, the first component 104 may include or correspond to a semiconductor device, a processor, a central processing unit (CPU), a graphic processing unit (GPU), an electronic module, an electrical component of an electronic device, or a combination thereof, as illustrative, non-limiting examples. The first component 104 may generate heat during operation of the first component 104. The first component 104 may be coupled to a circuit board 110 (e.g., a printed circuit board (PCB), a motherboard, a daughterboard, a video card, an accessory card, etc.). In some implementations, the circuit board 110 may include a socket (e.g., a land grid array (LGA)). The first component 104 may be coupled (e.g., electrically coupled) to the circuit board 110 via the socket. In a particular implementation, the socket may include a first plurality of electrical contacts (e.g. pins) that align with a second plurality of electrical contacts (e.g., pins) of the first component 104. Electrical contacts may be damaged during removal of the first component 104 if the first component 104 is lifted from the socket and then falls down onto the socket and the first electrical contacts.

The second component 108 of the thermal interface 102 may include or correspond to a heat dissipation device (e.g., a heat sink). The second component 108 may be coupled to a thermal interface object and a heat producing device to form the thermal interface 102. For example, the second component 108 may be coupled to the composite thermal interface object 106 and the first component 104 to form the thermal interface 102. In some implementations, the second component 108 may be coupled (e.g., fastened) to the circuit board 110 to secure the first component 104, the second component 108, and the composite thermal interface object 106 to the circuit board 110. Coupling the second component 108 to the first component 104, the circuit board 110, or both may apply a force to the first component 104, the composite thermal interface object 106, or both, to ensure intimate physical contact between the first component 104 and the composite thermal interface object 106 and between the composite thermal interface object 106 and the second component 108.

The second component 108 may be configured to dissipate heat received from a heat source or a thermal interface object. For example, the second component 108 may dissipate heat received from the first component 104, from the composite thermal interface object 106, or a combination thereof. To illustrate, the heat may flow from the first component 104 to the second component 108 via the composite thermal interface object 106. The second component 108 may be actively cooled or passively cooled. For example, the second component 108 may be actively cooled via forced circulation of a cooling fluid. The second component 108 may include a plurality of "fins" (e.g., vertical structures) configured to dissipate the heat. In some implementations, multiple heat sinks may be coupled to the composite thermal interface object 106 and the first component 104.

The composite thermal interface object 106 may be coupled (e.g., in contact with) to the first component 104 and the second component 108 to form the thermal interface 102. The composite thermal interface object 106 may be configured to transfer heat received from (e.g., generated by) the first component 104 to the second component 108. For example, the composite thermal interface object 106 may transfer heat received from a CPU to a heat sink. The composite thermal interface object 106 may be configured to deform to fill in gaps (e.g., air gaps) between the composite thermal interface object 106 and the first component 104, the second component 108, or both, under the applied force. Additionally or alternatively, the composite thermal interface object 106 may be configured to deform to conform to surface roughness of surfaces of the first component 104, the second component 108, or both, under the applied force.

The composite thermal interface object 106 may include a plurality of layers. Each layer may include one or more TIMs. In the implementation illustrated in FIG. 1, the composite thermal interface object 106 includes a first layer 112 and a second layer 114. The first layer 112 includes a first TIM that has first compliance characteristics. The compliance characteristics may include material properties or characteristics related to a compliance (or stiffness) of the layer. For example, the compliance of the layer may be determined based on the compliance characteristics of materials that form the layer and based on dimensions of the layer, such as a surface area and thickness of the layer. The compliance of a layer may include or correspond to an ability of the layer to resist deformation. To illustrate, the compliance characteristics may include or correspond to one or more of an elastic modulus (e.g., Young's modulus), a specific modulus, a bulk modulus, a shear modulus, a yield strength, a Poisson's ratio, as illustrative, non-limiting examples.

The first TIM of the first layer 112 may include first graphite fibers, and the first graphite fibers may be aligned in a direction 132 that is substantially orthogonal to a surface of the first layer 112, such as a first exterior surface 122. In some implementations, the first TIM may include silicon and oxygen. To illustrate, the first graphite fibers may be incorporated into a silicone polymer. In a particular implementation, the first layer 112 may include or correspond to a thermal interface pad. To illustrate, the first layer may include or correspond to a compliant thermal interface pad, such as a C4S compliant thermal interface pad manufactured by the Dexerials Corporation. In some implementations, the first graphite fibers may include or correspond to graphite nanofibers. In other implementations, the first layer 112 may include other carbon-based fibers or tubes, such as carbon nanofibers or carbon nanotubes. In a particular implementation, the first graphite fibers may constitute approximately 3 to 20 percent of the weight of the first layer 112 or the first TIM. In some implementations, the first graphite fibers may be dispersed substantially homogeneously throughout the first layer 112. In other implementations, the first graphite fibers may be concentrated into columns, as described with reference to FIG. 2.

Additionally or alternatively, the first TIM may include aluminum, boron, carbon, hydrogen, indium, nitrogen, silver, zinc, or a combination thereof. For example, the first TIM may include aluminum nitride, aluminum oxide, boron nitride, hydrocarbon oils, silver, zinc oxide, or a combination thereof, as illustrative, non-limiting examples. In some implementations, the first TIM may include or correspond to an electrically conductive material. In other implementations, the first TIM may include or correspond to an electrically resistive material (e.g., not electrically conductive).

The second layer 114 is coupled to or in contact with the first layer 112. For example, in some implementations the second layer 114 may be located between the first layer 112 and the first component 104. The second layer 114 includes a second TIM that has second compliance characteristics that are different from the first compliance characteristics of the first TIM. For example, a first elastic modulus of the first TIM may be less than a second elastic modulus of the second TIM. As another example, the first elastic modulus of the first TIM may be greater than the second elastic modulus of the second TIM. A compliancy (e.g., compliance characteristics) of a TIM may be based on a degree of crosslinking (e.g., a bond that links one polymer chain to another polymer chain) in the silicone polymer. The compliance characteristics of the TIMs may be controlled or adjusted by changing a degree of crosslinking (e.g., crosslink density) of the silicone polymer. Increasing the degree of crosslinking of the silicone polymer may make the TIM less compliant (e.g., stiffer). In some implementations, the second TIM may have a higher crosslink density than the first TIM. For example, an average molecular weight of the silicone polymer of the second TIM may be greater than an average molecular weight of the silicone polymer of the first TIM. The second layer 114 may be formed by extruding or printing the second TIM on the first layer 112.

The second TIM may include or correspond to a liquid TIM, a solid TIM, a gel TIM, or a phase change TIM. A phase change TIM may be in a solid phase at room temperature, but may change to a liquid phase at an operating temperature if the first component 104 (e.g., a temperature greater than room temperature). In some implementations, the second TIM may include silicon, oxygen, carbon, or a combination thereof. For example, the second TIM may include a silicone polymer and second graphite fibers. In some implementations, the second graphite fibers may be aligned (or arranged) in a second direction that is substantially parallel to the direction 132 of the first graphite fibers.

In a particular implementation, the second graphite fibers may be aligned with the first graphite fibers. To illustrate, a particular column of first graphite fibers may be substantially aligned with a particular column of second graphite fibers. In some implementations, the second layer 114 may include or correspond to a thermal interface pad. To illustrate, the second layer 114 may include or correspond to a stiff thermal interface pad, such as the CX stiff thermal interface pad manufactured by the Dexerials Corporation.

Additionally or alternatively, the second TIM may include aluminum, boron, hydrogen, indium, nitrogen, silver, zinc, or a combination thereof. For example, the second TIM may include aluminum nitride, aluminum oxide, boron nitride, hydrocarbon oils, silver, zinc oxide, or a combination thereof, as illustrative, non-limiting examples. In some implementations, the second TIM may include or correspond to an electrically conductive material. In other implementations, the second TIM may include or correspond to an electrically resistive material (e.g., not electrically conductive).

Although the composite thermal interface object 106 is illustrated as including the first layer 112 and the second layer 114, in other implementations, the composite thermal interface object 106 may include one or more additional layers, such as a third layer as described with reference to FIG. 4. The layers of the composite thermal interface object 106 may be uniform or non-uniform in thickness. For example, the first layer 112 may have a first thickness that is greater than a second thickness of the second layer 114. As another example, the first layer 112 may have a first thickness that is less than or equal to a second thickness of the second layer 114. Additional layers may have varying thicknesses. In some implementations, the overall thickness of the composite thermal interface object 106 may be in a range from 0.1 millimeter (mm) to 10 mm. In a particular implementation, the overall thickness of the composite thermal interface object 106 may be in a range from 0.25 mm to 5 mm. In other implementations, the overall thickness of the composite thermal interface object 106 may be less than 0.1 mm or greater than 10 mm. A ratio of the first thickness of the first layer 112 and the second thickness of the second layer 114 may depend on the compliance characteristics of the TIMs, the first component 104, the second component 108, or a combination thereof, and the ratio may be determined by testing. As illustrative, non-limiting examples, the ratio of the first thickness of the first layer 112 and the second thickness of the second layer 114 may be 1:1, 2:1, 4:1, 5:1, 10:1, etc.

Additionally or alternatively, a thickness of a particular layer of the composite thermal interface object 106 may be non-uniform across the particular layer. For example, a layer may be thicker or thinner at a center than at an edge. To illustrate, a layer may have a first thickness near the edge and have a different thickness in the center. In this example, a surface of the layer may be concave or convex. As another example, a thickness of a layer of the composite thermal interface object 106 may vary non-uniformly across the layer. To illustrate, a layer may include a plurality of thicknesses that vary non-uniformly in one or more directions. In this example, the surface of the layer may be wavy or irregular.

In some implementations, a topography of a surface of a layer of the composite thermal interface object 106 may correspond to a surface of the thermal interface 102. For example, a topography of an exterior surface (e.g., the exterior surfaces 122, 124) of a layer of the composite thermal interface object 106 may correspond to an inverse topography of a surface of a component of the thermal interface 102. To illustrate, a TIM may be formed or deposited to form a layer such that when a surface of the layer of the composite thermal interface object 106 and the surface of the component of the thermal interface 102 are joined in contact, air gaps are reduced or eliminated. An elevation at a particular point of the surface of the layer of the composite thermal interface object 106 may correspond to a depression at a corresponding point of the surface of the component of the thermal interface 102.

As an illustrative example, a topography of a second exterior surface 124 of the second layer 114 may correspond to an inverse of a topography of a surface of the second component 108 of the thermal interface 102. Additionally or alternatively, a topography of the first exterior surface 122 of the first layer 112 may correspond to an inverse of a topography of a surface of the first component 104 of the thermal interface 102. In other implementations, the first layer 112 may be in direct, physical contact with the second component 108 of the thermal interface 102 and the second layer 114 may be in direct, physical contact with the thermal interface.

Prior to operating an electrical device that includes the first component 104 and the second component 108, the composite thermal interface object 106 is coupled to (e.g., inserted between) the first component 104 and the second component 108 to form the thermal interface 102. The first component 104, the second component 108, and the composite thermal interface object 106 may be assembled and a force may be exerted on the thermal interface 102. For example, the socket of the circuit board 110 may include a device (e.g., a lever) to lock the thermal interface 102 in place, or fasteners may be used to attach the thermal interface 102 to the circuit board 110.

During operation of the electrical device, the first component 104 (e.g., a CPU) may generate heat and the composite thermal interface object 106 may transfer the heat to the second component 108 (e.g., the heat sink). When the first component 104 or the second component 108 of the electrical device is upgraded or replaced, the second component 108 may be uncoupled from the first component 104 and may be removed. During removal of the second component 108, the composite thermal interface object 106 may be less prone to adhere to the second component 108 and may stay relatively in place (e.g., may remain in contact with the first component 104). Alternatively, during removal of the second component 108, the composite thermal interface object 106 may adhere to the second component 108 and may be less prone to adhere to the first component 104. Thus, the first component 104 may remain relatively in place (e.g., may remain in contact with the circuit board 110). The first component 104 may not be lifted out of its socket and fall back down, potentially damaging the socket or the first component 104.

Thus, FIG. 1 illustrates an example of a composite thermal interface object including a plurality of layers. The composite thermal interface object 106 may have a first compliance (or stiffness) associated with the first layer 112 and may have a second compliance (or stiffness) associated with the second layer 114. For example, the first compliance of the first layer 112 may be greater (i.e. less stiff) than the second compliance of the second layers 114. To illustrate, the first exterior surface 122 of the first layer 112 may deform more than the second exterior surface 124 of the second layer 114. As another illustration, the first exterior surface 122 may deform more to fill more air gaps than the second exterior surface 124. The compliance may be based on a thickness of the layer, a shape of the layer, and the compliance characteristics of the TIM of the layer. Accordingly, by having layers with different compliances, a composite thermal interface object may reduce or prevent the occurrence of damage to a component of an electrical device.

Figure 2:
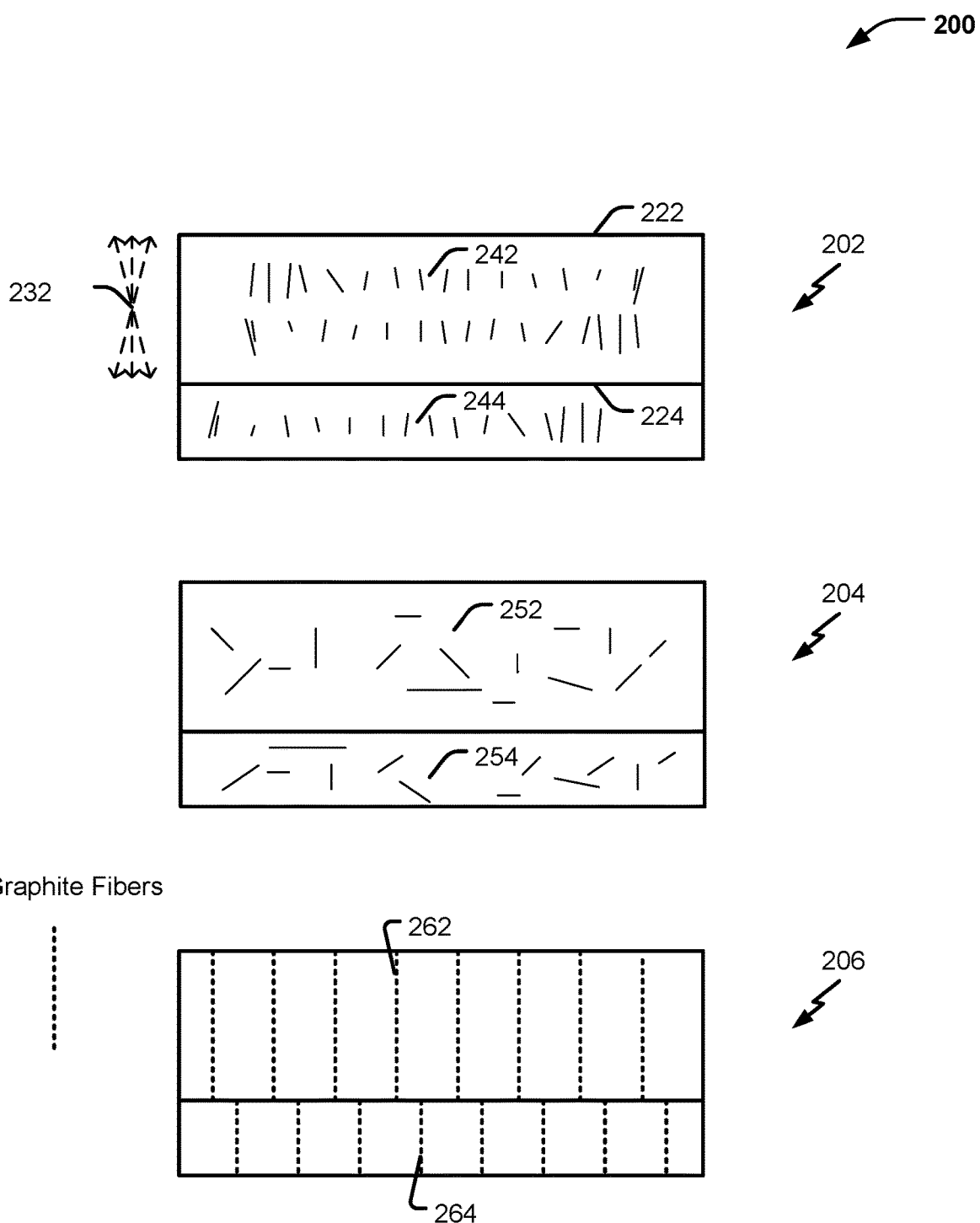
FIG. 2 is a diagram illustrating various examples of composite thermal interface objects.

FIG. 2 illustrates various examples of composite thermal interface objects. The various composite thermal interface objects each include a plurality of layers, such as a first layer and a second layer. For example, the various composite thermal interface objects may include the first layer 112 of FIG. 1 and the second layer 114 of FIG. 1. Additionally, the various composite thermal interface objects may also include additional layers, such as a third layer as described with reference to FIG. 4. Each layer may include one or more TIMs. Additionally, each layer may include graphite fibers. In some implementations, the graphite fibers may include or correspond to graphite nanofibers. In other implementations, the graphite fibers may include or correspond to other carbon-based fibers or tubes, such as carbon nanofibers or carbon nanotubes.

FIG. 2 illustrates a first composite thermal interface object 202 having first graphite fibers 242 that are aligned in a direction 232 that is substantially orthogonal to a surface of the first layer, such as a first surface 222 or a second surface 224. As illustrated in FIG. 2, the first graphite fibers 242 have similar orientations (e.g., mostly vertical in FIG. 2) that correspond to the direction 232. In some implementations, a portion of the first graphite fibers 242 may be aligned (e.g., substantially aligned) orthogonal to a surface of the first layer. For example, a first portion of the first graphite fibers 242 may be aligned in the direction 232 that is substantially orthogonal to the surface of the first layer and a second portion of the first graphite fibers 242 may not be aligned in the direction 232. In some implementations, the alignment (e.g., orientations) of the first graphite fibers 242 may result from a process or method used to form the first layer. To illustrate, the first TIM may be forced through a plurality of orifices to align the first graphite fibers 242. As another illustration, the first graphite fibers 242 may be aligned by application of a magnetic field. Because graphite fibers are diamagnetic, applying a magnetic field prior to or during curing of the first TIM may substantially align the first graphite fibers 242.

In some implementations, second graphite fibers 244 of the second layer may be aligned in a direction that is similar to the directions 232 of the first graphite fibers 242. In other implementations, the second graphite fibers 244 may not be aligned. In a particular implementation, a thickness of the second layer is small enough that aligning the second graphite fibers 244 may not significantly affect thermal conductivity of the composite thermal interface object.

FIG. 2 illustrates a second composite thermal interface object 204 having unaligned first graphite fibers 252. As illustrated in FIG. 2, the first graphite fibers 252 have multiple different orientations. The first layer may be formed independent of an aligning process, such as extruding the first TIM through a plurality of orifices or applying an external magnetic field prior to curing the first TIM. In some implementations, second graphite fibers 254 of the second layer may be unaligned similar to the first graphite fibers 252. In other implementations, the second graphite fibers 254 may be aligned in a direction that is substantially orthogonal to a surface of the second layer, similar to the alignment of the second graphite fibers 244 of the first composite thermal interface object 202.

FIG. 2 illustrates a third composite thermal interface object 206 having first graphite fibers 262 and second graphite fibers 264 that are aligned in a direction that is substantially orthogonal to a surface of the first layer. The third composite thermal interface object 206 includes dashed lines that represent higher concentrations of graphite fibers. For example, the first graphite fibers 262, the second graphite fibers 264, or both, may be arranged in columns and may be concentrated together. Each column may include a plurality of graphite fibers and may have a height that is similar to a thickness of a layer of the third composite thermal interface object 206. For example, a particular column may extend from at or near a surface of a particular layer to at or near another surface of the particular layer. The first graphite fibers 262, the second graphite fibers 264, or both, may be arranged or concentrated according to a formation of the first layer, the second layer, or both. To illustrate, the first graphite fibers 262 may be aligned and concentrated based on the first TIM being forced through a plurality of orifices.

In some implementations, the first layer, the second layer, or both, may include more columns or less columns than illustrated in FIG. 2. A number of columns and a spacing of the columns may be based on a size of the orifices, a spacing between orifices, a concentration of graphite fibers in a TIM, or a combination thereof. As another illustration, the first graphite fibers 262, the second graphite fibers 264, or both, may be aligned by an external magnetic field. Applying an external magnetic field prior to or during curing of a TIM may substantially align the first graphite fibers 262, the second graphite fibers 264, or both. Although the columns of the first graphite fibers 262 are illustrated in FIG. 2 as not being aligned (e.g., horizontally aligned) with the columns of the second graphite fibers 264, in other implementations, the columns of the first graphite fibers 262 may be substantially aligned with the columns of the second graphite fibers 264.

Thus, FIG. 2 illustrates various examples of composite thermal interface objects that include carbon-based fibers (e.g., graphite fibers). Adding carbon-based fibers to a TIM may make the corresponding layer more stiff (less complaint). By aligning the carbon-based fibers, less carbon-based fibers may be used to obtain the same thermal conductivity. Thus, by aligning the carbon-based fibers an increase in thermal conductivity and compliance of the composite thermal interface object can be achieved.

Figure 3:
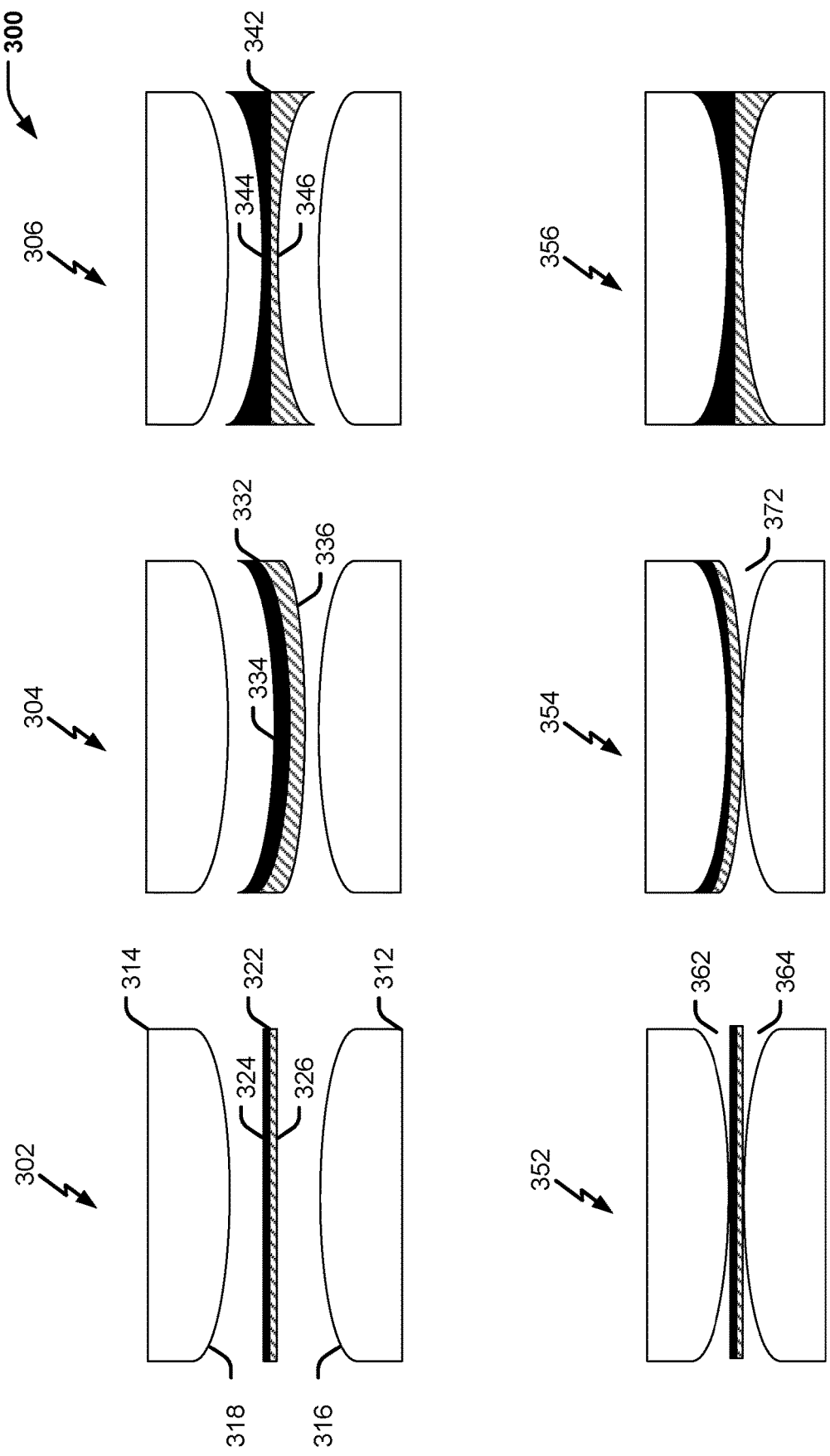
FIG. 3 is a diagram illustrating various examples of composite thermal interface objects and thermal interfaces.

Referring to FIG. 3, diagrams 302-306 and 352-356 illustrate various examples of composite thermal interface objects between a first component 312 and a second component 314 of a thermal interface. Diagrams 302-306 illustrate the various composite thermal interface objects prior to assembling the first component 312, the second component 314 and the various composite thermal interface objects. Diagrams 352-356 illustrate the various composite thermal interface objects after assembling the first component 312, the second component 314, and the various composite thermal interface objects to form the thermal interfaces. As discussed above with reference to FIG. 1, the first component 312 may be a heat producing device (e.g., a semiconductor device) and the second component 314 may be a heat dissipation device (e.g., a heat sink).

The various composite thermal interface objects each include a plurality of layers, such as a first layer (e.g., a solid black layer as illustrated in FIG. 3) and a second layer (e.g., a layer of diagonal lines as illustrated in FIG. 3). For example, the various composite thermal interface objects may include the first layer 112 of FIG. 1 and the second layer 114 of FIG. 1. The various composite thermal interface objects may also include additional layers, such as a third layer as described with reference to FIG. 4. Each layer may include one or more TIMs. Additionally, each layer may include carbon-based fibers as described with reference to FIGS. 1 and 2.

Diagram 302 illustrates a first composite thermal interface object 322 located between the first component 312 and the second component 314 prior to assembling the first component 312, the first composite thermal interface object 322, and the second component 314 to form the thermal interface. Diagram 352 illustrates the first composite thermal interface object 322 coupled to (e.g., in contact with) to an exterior surface of the first component 312 (e.g., a semiconductor device) and an exterior surface of the second component 314 (e.g. the heat sink) after assembly. For example, a surface 324 of the first layer may be coupled to a surface 318 of the second component 314 and a surface 326 of the second layer may be coupled to a surface 316 of the first component 312.

The formation of the thermal interface using the first composite thermal interface object 322 may result in a presence of one or more air gaps 362 and 364 in the thermal interface which may increase thermal resistance and may decrease thermal conductivity (heat transfer). As the first composite thermal interface object 322 may be compliant, the first composite thermal interface object 322 may fill in microscopic roughness (e.g., surface unevenness, surface imperfections, etc.) of the exterior surfaces of the first component 312 and second component 314. However, as the first composite thermal interface object 322 is flat, assembling the first component 312, the first composite thermal interface object 322, and the second component 314 to form the thermal interface may result in less contact area with the surfaces 316, 318 of the first component 312 and the second component 314.

Diagrams 304 and 306 illustrate composite thermal interface objects where at least one layer (or a surface thereof) of the composite thermal interface object is based on a surface (e.g., the surface 316, the surface 318, or both) of a component of the thermal interface. For example, the first layer (or the surface thereof) of the composite thermal interface object may be formed based on a topography of the surface 318 of the second component 314. To illustrate, the surface 318 of the second component 314 may be scanned, and the first layer may be extruded or molded such that a topography of the surface of the first layer correspond to an inverse (or reverse) topography of the topography of the surface 318, as described further with reference to FIGS. 5 and 6.

Diagram 304 illustrates a second composite thermal interface object 332 located between the exterior surfaces of the first component 312 and second component 314 prior to assembly to form the thermal interface. A surface 334 of the first layer may be formed based on the surface 318 of the second component 314 and a surface 336 of the second layer may not be formed based on the surface 316 of the first component 312. Diagram 354 illustrates the second composite thermal interface object 332 coupled to the exterior surfaces of the first component 312 and the second component 314 after assembly. For example, the surface 334 of the first layer may be coupled to the surface 318 of the second component 314 and the surface 336 of the second layer may be coupled to the surface 316 of the first component 312.

The formation of the thermal interface using the second composite thermal interface object 332 may reduce one or more air gaps in the thermal interface. For example, by forming the surface 334 of the first layer based on the surface 318 of the second component 314 air gaps (e.g., air gaps 362) may be reduced or eliminated between the second component 314 and the second composite thermal interface object 332. Air gaps 372 may still exist between the first component 312 and the second composite thermal interface object 332 (e.g., the first layer of the second composite thermal interface object 332). As the second composite thermal interface object 332 may be compliant and has a greater surface contact than the first composite thermal interface object 322, the second composite thermal interface object 332 may fill in more microscopic surface imperfections than the first composite thermal interface object 322.

Although the first layer and second layer are illustrated as being concave (with respect to the first component 312), in other implementations, the first layer, the second layer, or both, may be other shapes (e.g., flat, convex, wavy, etc.). In some implementations, the shape of the second composite thermal interface object 332 (or a layer thereof) may correspond to the topography of a surface (e.g., the surface 316 or the surface 318) of a component (e.g., the first component 312 or the second component 314). In a particular implementation, a first shape of the first layer may be different from a second shape of the second layer. As an illustrative, non-limiting example, the first shape may be curved and the second shape may be relatively flat or planar.

Diagram 306 illustrates a third composite thermal interface object 342 located between the exterior surfaces of the first component 312 and second component 314 prior to assembly to form the thermal interface. A surface 344 of the first layer may be formed based on the surface 318 of the second component 314 and a surface 346 of the second layer may be formed based on the surface 316 of the first component 312. Diagram 356 illustrates the third composite thermal interface object 342 coupled to the exterior surfaces of the first component 312 and the second component 314 after assembly. For example, the surface 344 of the first layer may be coupled to the surface 318 of the second component 314 and the surface 346 of the second layer may be coupled to the surface 316 of the first component 312.

The formation of the thermal interface using the third composite thermal interface object 342 may reduce one or more air gaps in the thermal interface. For example, by forming the surface 344 of the first layer based on the surface 318 of the second component 314 and by forming the surface 346 of the second layer based on the surface 316 of the first component 312 air gaps (e.g., air gaps 362, 364, 372) may be reduced or eliminated between the first component 312 and the third composite thermal interface object 342 and between the second component 314 and the third composite thermal interface object 342. As the third composite thermal interface object 342 may be compliant and has a greater surface contact than the first composite thermal interface object 322 or the second composite thermal interface object 332, the third composite thermal interface object 342 may fill in more microscopic surface imperfections than the first composite thermal interface object 322 or the second composite thermal interface object 332.

Although the third composite thermal interface object 342 is illustrated as having an hourglass shape, with an edge thickness greater than a center thickness, in other implementations, the third composite thermal interface object 342 may have other shapes according to topographies of the surfaces of the components of the thermal interface.

Thus, by creating layers of a composite thermal interface object based on the surface 316 of the first component 312, the surface 318 of the second component 314, or both, the composite thermal interface object may mitigate formation of air gaps. Accordingly, the composite thermal interface object may have a lower thermal resistance and a higher thermal conductivity.

Figure 4:
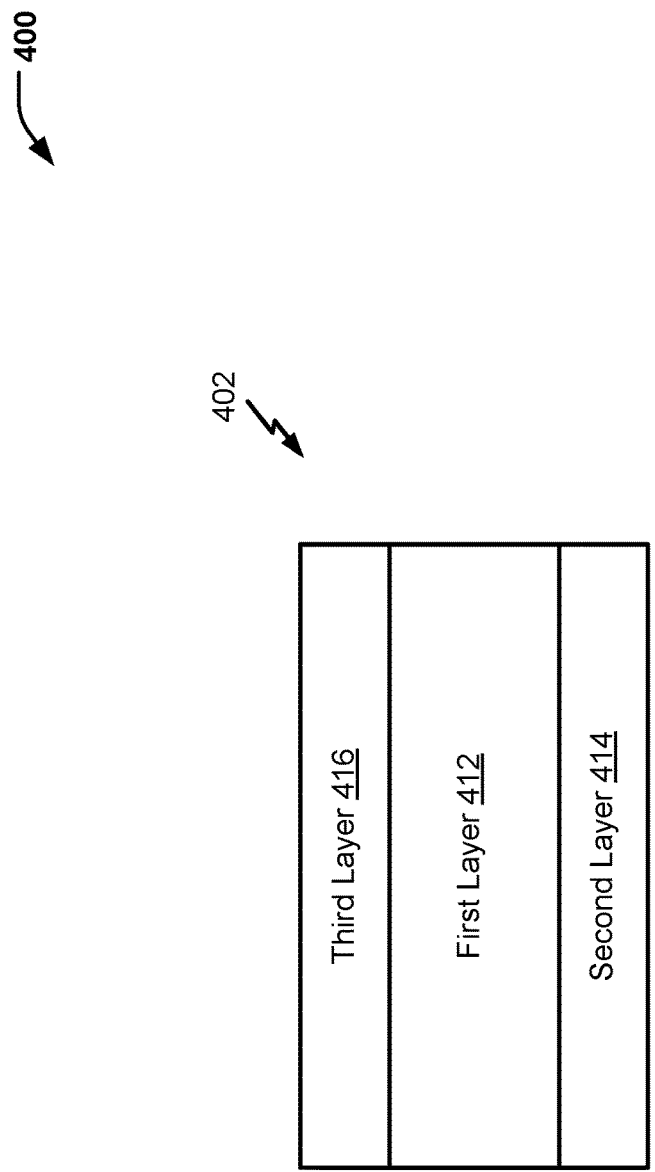
FIG. 4 is a diagram illustrating another example of a composite thermal interface object.

Referring to FIG. 4, a diagram 400 illustrates another example of a composite thermal interface object 402. The composite thermal interface object 402 includes a plurality of layers, including a first layer 412, a second layer 414, and a third layer 416. For example, the first layer 412 may include or correspond to the first layer 112 of FIG. 1, and the second layer 414 may include or correspond to the second layer 114 of FIG. 1. Each layer may include one or more TIMs. For example, the first layer 412 may include a first TIM, such as the first TIM of FIG. 1, and the second layer 414 may include a second TIM, such as the second TIM of FIG. 1. Although the first layer 412 is illustrated as being located between the second layer 414 and the third layer 416, in other implementations, the second layer 414 may be located between the first layer 412 and the third layer 416.

The third layer 416 may include or correspond to the first layer 112 of FIG. 1, the second layer 114 of FIG. 1, or a different layer. The third layer 416 may include a third TIM that has third compliance characteristics that are different from the first compliance characteristics of the first TIM. For example, the first elastic modulus of the first TIM may be less than a third elastic modulus of the third TIM. As another example, the first elastic modulus of the first TIM may be greater than the third elastic modulus of the third TIM. In some implementations, the third compliance characteristics may be different from the second compliance characteristics of the second layer 414. For example, the second elastic modulus of the second TIM may be less than a third elastic modulus of the third TIM. As another example, the second elastic modulus of the second TIM may be greater than the third elastic modulus of the third TIM. In other implementations, the third compliance characteristics may be the same as the second compliance characteristics of the second TIM. For example, the third TIM may be the same as the second TIM of the second layer 414.

The third TIM may be a liquid TIM, a solid TIM, a gel TIM, or a phase change TIM. In some implementations, the third TIM may include silicon, oxygen, and carbon. For example, the third TIM may include a silicone polymer and third graphite fibers. In some implementations, the third graphite fibers may be aligned (or arranged) in a third direction that is substantially parallel to the direction of first graphite fibers of the first layer 412. In a particular implementation, the third graphite fibers may be aligned with the first graphite fibers, the second graphite fibers, or both. To illustrate, a particular column of first graphite fibers may be substantially aligned with a particular column of third graphite fibers. In some implementations, the third layer 416 may include or correspond to a thermal interface pad. To illustrate, the third layer 416 may include or correspond to a stiff thermal interface pad, such as the CX stiff thermal interface pad manufactured by the Dexerials Corporation.

Additionally or alternatively, the third TIM may include aluminum, boron, hydrogen, indium, nitrogen, silver, zinc, or a combination thereof. For example, the third TIM may include aluminum nitride, aluminum oxide, boron nitride, hydrocarbon oils, silver, zinc oxide, or a combination thereof, as illustrative, non-limiting examples. In some implementations, the third TIM may include or correspond to an electrically conductive material. In other implementations, the third TIM may include or correspond to an electrically resistive material (e.g., not electrically conductive).

The first layer 412, the second layer 414, the third layer 416, or a combination thereof, of the composite thermal interface object 402 may have a thickness that is uniform or non-uniform. Additionally, one or more of the first layer 412, the second layer 414, the third layer 416, or additional layers may have a thickness that is different from a thickness of another layer. For example, the first layer 412 may have a first thickness that is greater than a third thickness of the third layer 416. As another example, the first layer 412 may have a first thickness that is less than or equal to a third thickness of the third layer 416.

In some implementations, the third layer 416 (or a surface thereof) may be formed based on a surface of a component of the thermal interface. For example, the third layer 416 may be formed based on a surface of a heat sink (e.g., the second component 108 of FIG. 1) such that a topography of a surface of the third layer 416 corresponds to an inverse topography of the surface of the heat sink.

A composite thermal interface object that includes a first layer, a second layer, and a third layer, may retain the benefits of compliant thermal interface pads (e.g., high thermal conductivity), while reducing a risk of damage to components of the thermal interface due to the composite thermal interface object adhering to and dislodging a component of the thermal interface.

Figure 5:
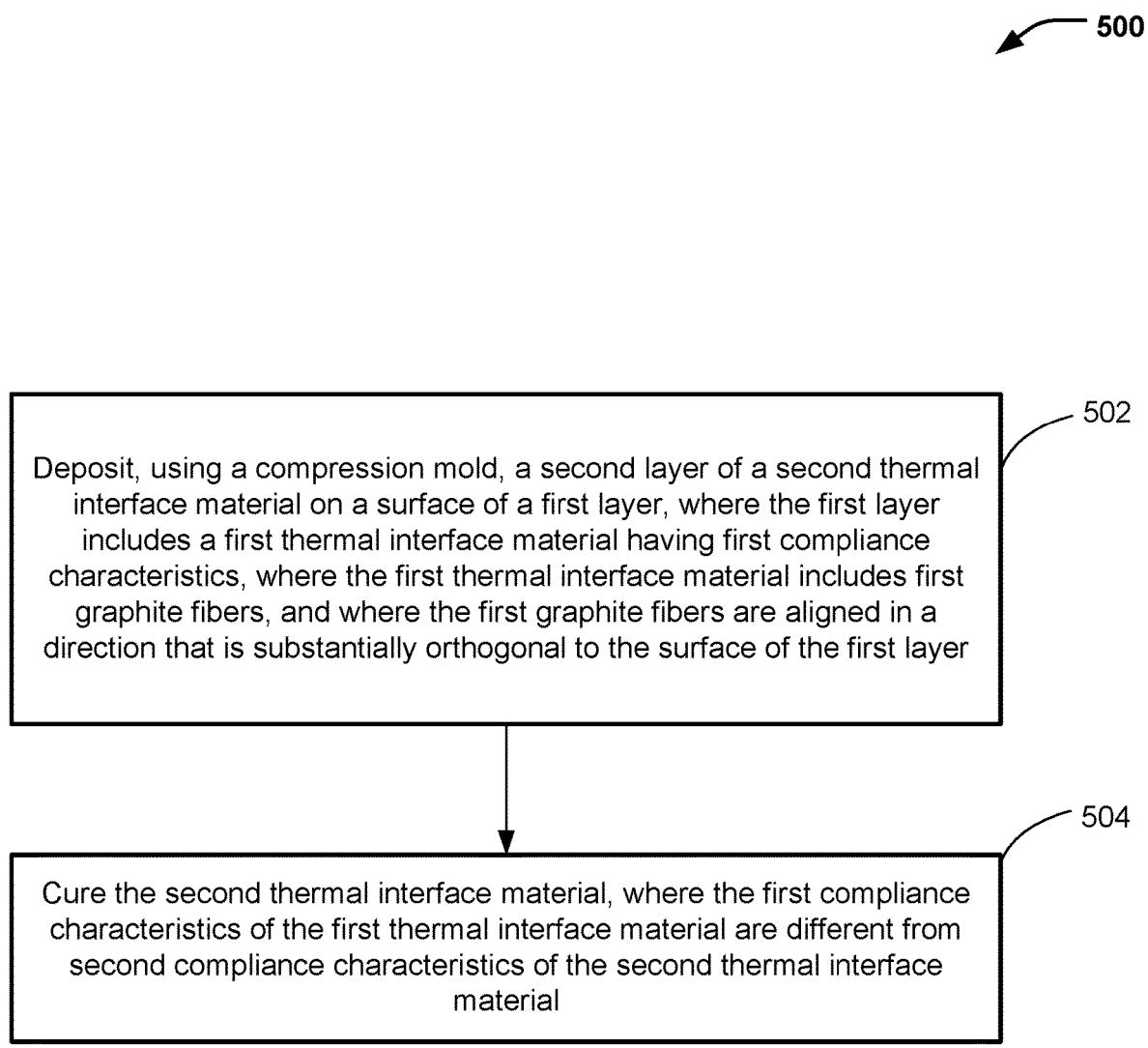
FIG. 5 is a flow diagram showing a particular example of a method of forming a composite thermal interface object.

Referring to FIG. 5, a flow diagram illustrates an example of a method 500 of forming a composite thermal interface object by molding one or more layers of the composite thermal interface object. In the example method 500 of FIG. 5, one or more deposition operations may be used to form layers of the composite thermal interface object. For example, one or more depositions operations may be used to form a first layer, a second layer, a third layer, or a combination thereof, of the composite thermal interface object. The composite thermal interface object may include or correspond to one or more of the composite thermal interface object 106 of FIG. 1, the composite thermal interface objects 202-206 of FIG. 2, the composite thermal interface objects 322-342 of FIG. 3, or the composite thermal interface object 402 of FIG. 4.

The method 500 includes depositing, using a compression mold, a second layer of a second thermal interface material on a surface of a first layer, at 502. The first layer includes a first thermal interface material having first compliance characteristics. The first thermal interface material includes first graphite fibers, and the first graphite fibers are aligned in a direction that is substantially orthogonal to the surface of the first layer. For example, the first layer and the second layer may include or correspond to the first layer 112, the second layer 114 of FIG. 1, or the third layer 416 of FIG. 4. The second thermal interface material may include or correspond to the first TIM, the second TIM of FIG. 1, or the third TIM of FIG. 4. The first graphite fibers may include or correspond to the graphite fibers as described in FIGS. 1 and 2, and the direction may include or correspond to the direction 132 of FIG. 1. In other implementations, the second layer may be formed by other molding procedures, such as transfer molding, matrix molding injection molding, extrusion molding, etc.

The method 500 includes curing the second thermal interface material, at 504. After curing the second thermal interface material, the first compliance characteristics of the first thermal interface material are different from second compliance characteristics of the second thermal interface material. For example, a first elastic modulus of the first thermal interface material may be less than a second elastic modulus of the second thermal interface material. The compliance characteristics may include or correspond to one or more of an elastic modulus (e.g., Young's modulus), a specific modulus, a bulk modulus, a shear modulus, a yield strength, a Poisson's ratio, or a combination thereof.

In some implementations, curing the second thermal interface material may include applying heat, pressure, or both, to the second thermal interface material. For example, the second thermal interface material may be heated by convection, conduction, or radiation. Additionally or alternatively, curing the second thermal interface material includes cooling the second thermal interface material. For example, cooling the second thermal interface material may include ceasing applying heat, releasing pressure, cooling the second thermal interface material at an ambient temperature, or a combination thereof. In a particular implementation, the second thermal interface material may already be heated (e.g., pre-heated) before heat is applied to cure the second thermal interface material.

In some implementations, the second thermal interface material includes a silicone polymer and second graphite fibers. In a particular implementation, depositing the second thermal interface material using the compression mold aligns the second graphite fibers in a second direction that is substantially parallel to the direction of the first graphite fibers. For example, the mold may include a plurality of orifices which align the second graphite fibers as the second thermal interface material is forced through the orifices. As another example, the mold or another device may apply an external magnetic field to align the second graphite fibers.

In some implementations, the method 500 includes depositing, using a second compression mold, a third layer of a third thermal interface material on a second surface of the first layer. The first layer may be located between the second layer and the third layer. In some implementations, depositing the third layer may be performed after depositing the second layer. In other implementations, depositing the third layer may be performed prior to depositing the second layer. In a particular implementation, the compression mold and the second compression mold may be the same. The method 500 further includes curing the third thermal interface material. The first compliance characteristics of the first thermal interface material may be different from third compliance characteristics of the third thermal interface material. For example, the first elastic modulus of the first TIM may be less than a third elastic modulus of the third TIM. As another example, the first elastic modulus of the first TIM may be greater than the third elastic modulus of the third TIM. Additionally, the third compliance characteristics may be different from the second compliance characteristics of the second TIM. For example, the second elastic modulus of the second TIM may be less than a third elastic modulus of the third TIM. As another example, the second elastic modulus of the second TIM may be greater than the third elastic modulus of the third TIM. In other implementations, the third compliance characteristics may be the same as the second compliance characteristics of the second TIM. For example, the third TIM may include the same components as the second TIM of the second layer 114.

In some implementations, the method 500 includes forming the first layer prior to depositing the second layer. The first layer may be formed by extrusion or by molding, as illustrative, non-limiting example. In a particular implementation, the first layer may be partially cured prior to depositing the second layer and curing the second layer may also cure the first layer.

Thus, FIG. 5 illustrates an example of a method of forming a composite thermal interface object that includes a first layer and a second layer. The composite thermal interface object may be less prone to adhere to components of the thermal interface than conventional compliant thermal interface pads. Thus, the composite thermal interface object may reduce or eliminate damage to electrical components when removing or replacing electrical components.

Figure 6:
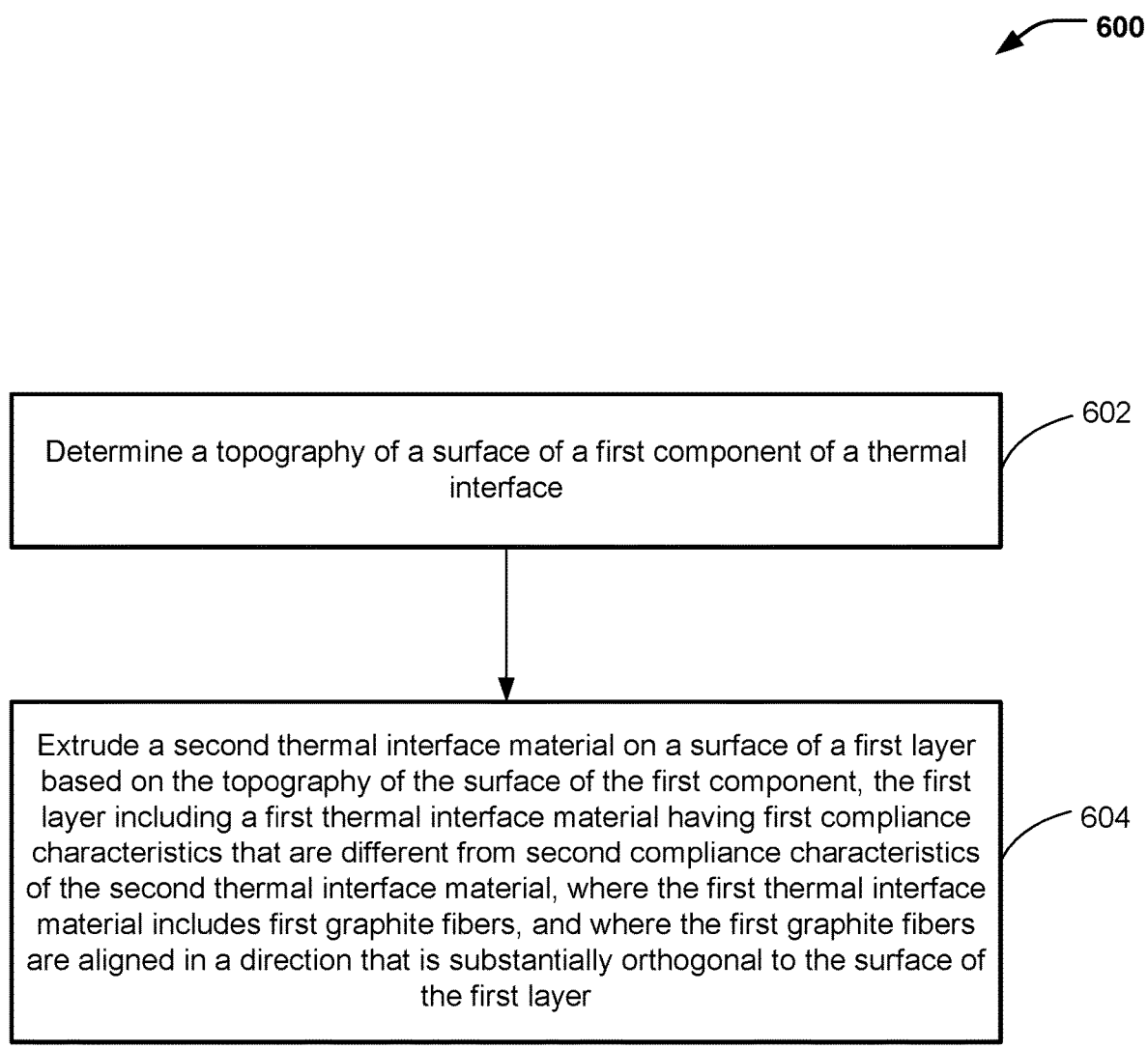
FIG. 6 is a flow diagram showing another particular example of a method of forming a composite thermal interface object.

Referring to FIG. 6, a flow diagram illustrates an example of a method 600 of forming a composite thermal interface object by extruding one or more layers of the composite thermal interface object. In the example of FIG. 6, one or more extrusion operations may be used to form layers of the composite thermal interface object where one or more surfaces of the composite thermal interface object are formed based on a topography of a surface of a component of a thermal interface. For example, one or more depositions operations may be used to form a first layer, a second layer, a third layer, or a combination thereof, of the composite thermal interface object based on surfaces of components of the thermal interface. The composite thermal interface object may include or correspond to one or more of the composite thermal interface object 106 of FIG. 1, the composite thermal interface objects 202-206 of FIG. 2, the composite thermal interface objects 322-342 of FIG. 3, or the composite thermal interface object 402 of FIG. 4.

The method 600 includes determining a topography of a surface of a first component of a thermal interface, at 602. For example, the first component may include or correspond to the first component 104, the second component 108 of FIG. 1, or both. The surface of the first component may include or correspond to a surface that is coupled to the first exterior surface 122 of the first layer 112 or the second exterior surface 124 of the second layer 114. To illustrate, a surface of the first component may be scanned (or characterized) by a scanning device. As an illustrative, non-limiting example, the scanning device includes a laser and performs a scan using the laser. In other implementations, the scanning device may utilize a charge-coupled device (CCD) or complementary metal-oxide-semiconductor (CMOS) type scanner to scan the surface. Scanning a surface may include the scanning device taking a plurality of measurements to generate measurement data (e.g., topography data). The measurement data may be indicative of a topography of an exterior surface of the first component. Additionally or alternatively, the measurement data associated with the surface of the first component is derived based on the scan or a result thereof (e.g., an image). For example, the measurement data may be derived by another device that processes scanning data generated by the scanning device to derive the measurement data.

The method 600 includes extruding a second thermal interface material on a surface of a first layer based on the topography of the surface of the first component, at 604. The first layer includes a first thermal interface material having first compliance characteristics that are different from second compliance characteristics of the second thermal interface material. The first thermal interface material may include first graphite fibers, and the first graphite fibers may be aligned in a direction that is substantially orthogonal to the surface of the first layer. For example, each of the first thermal interface material and the second thermal interface material may include or correspond to the first TIM of FIG. 1, the second TIM of FIG. 1, the third TIM of FIG. 4, or a combination thereof. The first layer may include or correspond to the first layer 112, the second layer 114 of FIG. 1, or the third layer 416 of FIG. 4.

In some implementations, extruding the second thermal interface material may include generating a second layer by applying, printing, dispersing, or patterning the second thermal material based on the topography of the surface of the first component. To illustrate, in a particular implementation the measurement data is inverted so that an inverted replica of the topography of the surface of the first component may be created (as the surface of the second layer) to fill any gaps within the topography of the surface of the first component. Additionally, a second surface of a second component of the thermal interface may be scanned by the scanning device and second measurement data may be generated that is indicative of a second topography of the second exterior surface. In a particular implementation, extruding the second thermal interface material forms the second layer having a second topography that corresponds to an inverse topography of the topography of the surface of the first component.

In some implementations, the method 600 includes forming the first layer including the first thermal interface material. For example, forming the first layer may include depositing the first thermal interface material and then curing the first thermal interface material. To illustrate, the first thermal interface material may heated and deposited into a mold or dye to cool and cure. As an illustrative, non-limiting example, the first thermal interface material may be heated by convection (e.g., air in an oven) and then cooled at approximately room temperature. In a particular implementation, forming the first layer may include partially curing the first layer. The first layer may be fully cured during curing the second layer.

In some implementations, the method 600 includes forming the first layer based on a second surface of a second component of the thermal interface. For example, forming the first layer based on the second surface of the second component may include extruding the first thermal interface material based on an inverted topography of the second surface. As another example, the first layer may be formed and then machined, etched or laser cut to include a surface that has a topography that corresponds to the inverted topography of the second surface. In some implementations, after the topography of both the surface of the first component and the surface of the second component has been measured, the composite thermal interface object is created. In other implementations, a first surface may be scanned and then a layer may be generated before a second layer is scanned and generated.

In a particular implementation, extruding the second thermal interface material includes programming inverted topography data (e.g., inverted measurement data) into a computer controlled machine. As an illustrative, non-limiting example, the machine may include or correspond to a 3D printing device. The programming may control a formation of the second layer of the composite thermal interface object. For example, the second layer may be configured to fill air gaps that may form during coupling a surface of the second layer to a surface of a component of the thermal interface due to irregularities in the respective typography. Following the creation of the composite thermal interface object, the composite thermal interface object is coupled to the exterior surfaces of the components to form the thermal interface. The thermal interface may include a reduced amount of gaps, a reduced size of air gaps, or both, as compared to a thermal interface that includes a thermal interface object with flat or planar surfaces. Thus, a more thermally conductive thermal interface may be created, as compared to thermal interface objects with flat or planar surfaces.

In some implementations, the method 600 also includes coupling the surface of the second layer to a surface of a component of a thermal interface. For example, the surface of the second layer may be coupled with the first component (e.g., the semiconductor device) of the thermal interface. In other implementations, the surface of the second layer may be coupled with the second component (e.g., the heat sink) of the thermal interface. To illustrate, coupling the two surfaces includes applying the composite thermal interface object directly onto the surface. Since the surface of the second layer may be formed based on topography data associated with the surface of first component or the second component one or more surfaces of the composite thermal interface object may be substantially aligned with the surface of the first component or the second component.

In some implementations, the method 600 also includes applying an external magnetic field to align the second graphite fibers. For example, an external magnetic field generating device may generate a magnetic field. The magnetic field may be configured to substantially align the second graphite fibers in the same direction as the first graphite fibers.

Thus, FIG. 6 illustrates an example of a method of forming a composite thermal interface object that includes a first layer, and a second layer formed by extruding a second TIM based on a topography of a surface a component of a thermal interface. This results in a composite thermal interface object that provides more intimate contact between the components. Accordingly, the composite thermal interface object minimizes the existence of air gaps to improve thermal conductivity and heat removal (e.g. reduces thermal resistance). Furthermore, this method provides the ability to pattern a TIM across the surface of an electronic component without stenciling or template creation for topographical characteristics associated with each exterior surface. Additionally, the composite thermal interface object may be less prone to adhere to components of the thermal interface than conventional complaint thermal interface pads, because the second layer may have different compliance characteristics than the first layer. Thus, the composite thermal interface object may reduce or eliminate damage to electrical components when removing or replacing electrical components.

The previous description of the disclosed implementations is provided to enable any person skilled in the art to make or use the disclosed implementations. Various modifications to these implementations will be readily apparent to those skilled in the art, and the generic principles defined herein may be applied to other implementations without departing from the scope of the disclosure. Thus, the present disclosure is not intended to be limited to the implementations shown herein but is to be accorded the widest scope possible consistent with the principles and features as defined by the following claims.

The invention claimed is:

1. A composite thermal interface object comprising:
a first layer partially covering a heat producing device, the first layer comprising a first silicone polymer having a first elastic modulus, and first graphite fibers aligned in a direction that is substantially orthogonal to a surface of the first layer and in a first set of concentrated graphite columns;
a second layer comprising second graphite fibers, zinc oxide, and a second silicone polymer having a second elastic modulus different from the first elastic modulus; and a third layer comprising third graphite fibers, the third layer having a third elastic modulus different from the first elastic modulus, wherein:

at least one surface of the second layer has curvature, wherein the curvature of the surface of the second layer corresponds to an inverse curvature of the heat producing device, and at least one surface of the third layer has curvature, wherein the curvature of the surface of the third layer corresponds to an inverse curvature of a heat dissipation device, wherein the composite thermal interface object comprises an hourglass shape, the first layer being located between the second layer and the third layer, the first layer being substantially uniform in thickness, and at least one of the second graphite fibers or the third graphite fibers are not aligned in a direction parallel to the direction of the first graphite fibers, at least one of the second graphite fibers or the third graphite fibers are arranged in a second set of concentrated graphite columns parallel and offset from the first set of concentrated graphite columns.

2. The composite thermal interface object of claim 1, wherein the first elastic modulus is less than the second elastic modulus.

3. The composite thermal interface object of claim 1, wherein a first thickness of the first layer is greater than a second thickness of the second layer.

4. The composite thermal interface object of claim 1, wherein a second thickness of the second layer is based on a topography of a surface of a heat producing device of a thermal interface, and wherein the second thickness is non-uniform.

5. The composite thermal interface object of claim 4, wherein the heat producing device corresponds to a semiconductor, a processor, a central processing unit, a graphic processing unit, an electronic module, an electrical component of an electronic device, or a combination thereof.

6. The composite thermal interface object of claim 1, wherein a topography of a surface of the second layer corresponds to an inverse topography of a first surface of the heat producing device of a thermal interface, and wherein a topography of a surface of the third layer corresponds to an inverse topography of a second surface of the heat dissipation device of the thermal interface.

7. The composite thermal interface object of claim 1, wherein the composite thermal interface object has a thickness of from 0.1 mm to 10 mm.

8. The composite thermal interface object of claim 1, wherein the composite thermal interface object has a thickness of from 0.25 mm to 5 mm.

9. The composite thermal interface object of claim 1, wherein the composite thermal interface object has a thickness of less than 0.1 mm.

10. The composite thermal interface object of claim 1, wherein a ratio of a first thickness of the first layer to a second thickness of the second layer is from 1:1 to 10:1.

11. The composite thermal interface object of claim 1, wherein a ratio of a first thickness of the first layer to a second thickness of the second layer is from 1:1 to 5:1.

12. The composite thermal interface object of claim 1, wherein the first graphite fibers constitute from 3 wt% to 20 wt% of the first layer.

13. A composite thermal interface object comprising:

a first layer partially covering a heat producing device, the first layer comprising a first silicone polymer having a first elastic modulus, and first graphite fibers aligned in a direction that is substantially orthogonal to a surface of the first layer, wherein the first graphite fibers are arranged in concentrated graphite fiber columns, each column having a height substantially equal to a thickness of the first layer, each column being uniformly spaced apart from adjacent columns;

a second layer comprising second graphite fibers, zinc oxide, and a second silicone polymer having a second elastic modulus different from the first elastic modulus; and a third layer comprising third graphite fibers, the third layer having a third elastic modulus different from the first elastic modulus, wherein:

at least one surface of the second layer has curvature, wherein the curvature of the surface of the second layer corresponds to an inverse curvature of the heat producing device, and at least one surface of the third layer has curvature, wherein the curvature of the surface of the third layer corresponds to an inverse curvature of a heat dissipation device, wherein the composite thermal interface object comprises an hourglass shape, the first layer being located between the second layer and the third layer, at least one of the second graphite fibers or the third graphite fibers are not aligned in a direction parallel to the direction of the first graphite fibers, the composite thermal interface object has a thickness of from 0.25 mm to 5 mm, a ratio of a first thickness of the first layer to a second thickness of the second layer is from 1:1 to 10:1, and the first graphite fibers constitute from 3 wt% to 20 wt% of the first layer.

14. The composite thermal interface object of claim 13, wherein the first elastic modulus is less than the second elastic modulus.

15. The composite thermal interface object of claim 13, wherein the first thickness of the first layer is greater than the second thickness of the second layer.

16. The composite thermal interface object of claim 13, wherein the second thickness of the second layer is based on a topography of a surface of a heat producing device of a thermal interface, and wherein the second thickness is non-uniform.

17. The composite thermal interface object of claim 16, wherein the heat producing device corresponds to a semiconductor, a processor, a central processing unit, a graphic processing unit, an electronic module, an electrical component of an electronic device, or a combination thereof.

18. A composite thermal interface object comprising:

a first layer partially covering a heat producing device, the first layer comprising first graphite fibers, zinc oxide, and a first silicone polymer having a first elastic modulus, wherein the first graphite fibers are aligned in a direction that is substantially orthogonal to a surface of the first layer and in a first set of concentrated graphite columns;

a second layer comprising second graphite fibers, zinc oxide, and a second silicone polymer having a second elastic modulus different from the first elastic modulus; and a third layer comprising third graphite fibers, the third layer having a third elastic modulus different from the first elastic modulus, wherein:

the first elastic modulus is less than the second elastic modulus, at least one surface of the second layer has curvature, wherein the curvature of the surface of the second layer corresponds to an inverse curvature of the heat producing device, and at least one surface of the third layer has curvature, wherein the curvature of the surface of the third layer corresponds to an inverse curvature of a heat dissipation device, wherein the composite thermal interface object comprises an hourglass shape, the first layer being located between the second layer and the third layer, at least one of the second graphite fibers or the third graphite fibers are not aligned in a direction parallel to the direction of the first graphite fibers, at least one of the second graphite fibers or the third graphite fibers are arranged in a second set of concentrated graphite columns parallel and offset from the first set of concentrated graphite columns, the composite thermal interface object has a thickness of from 0.25 mm to 5 mm, a ratio of a first thickness of the first layer to a second thickness of the second layer is from 1:1 to 10:1, the second thickness of the second layer is based on a topography of a surface of the heat producing device of a thermal interface, the second thickness is non-uniform, and the first graphite fibers constitute from 3 wt% to 20 wt% of the first layer.

19. The composite thermal interface object of claim 18, wherein the heat producing device corresponds to a semiconductor, a processor, a central processing unit, a graphic processing unit, an electronic module, an electrical component of an electronic device, or a combination thereof.

20. The composite thermal interface object of claim 18, wherein the ratio of the first thickness of the first layer to the second thickness of the second layer is from 1:1 to 5:1.

\* \* \* \* \*